Aug. 15, 1961 R. M. LUKES 2,996,408
COPPER PLATING PROCESS AND SOLUTION
Filed March 31, 1958
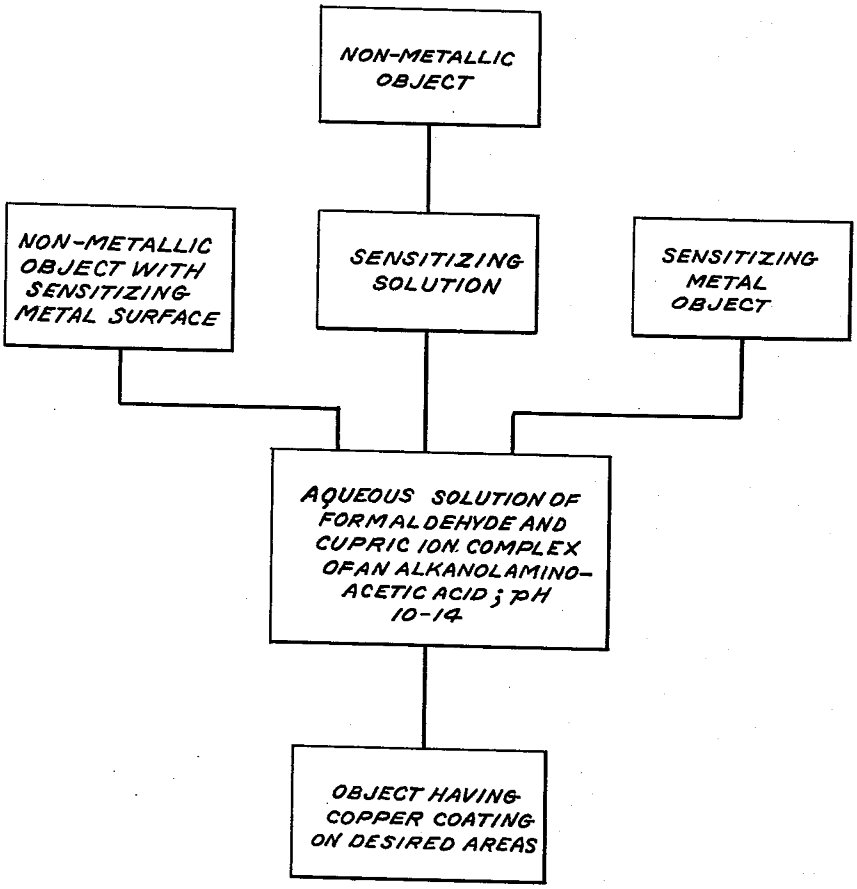
Inventor:
Robert M. Lukes,
by James H. Underwood
His Agent, United States Patent Office
2,996,408
Patented Aug. 15, 1961

2,996,408

COPPER PLATING PROCESS AND SOLUTION

Robert M. Lukes, Schenectady, N.Y., assignor to General Electric Company, a corporation of New York Filed Mar. 31, 1958, Ser. No. 725,452
11 Claims. (Cl. 117—71)

The present invention relates to a copper plating process and solution. More particularly, the invention relates to an autocatalytic chemical reduction process and a bath for plating the desired thickness of copper on objects having an active metallic surface. Still more particularly, this invention relates to an autocatalytic chemical reduction process and bath for plating the desired thickness of copper on objects having a catalytic metallic surface without simultaneously causing the plating of undesired surfaces, and/or the precipitation of cuprous oxide from the solution.

Previously, it has been necessary to electroplate copper onto the surface of objects when it was desired to produce a relatively thick coating. While this method of copper plating is satisfactory for many purposes, it is objectionable in that it requires the use of rather elaborate and somewhat expensive electrical equipment, close control of the bath composition while being used, and, when it is desired to copper plate a non-metallic object such as a molded, laminated or otherwise shaped article containing a thermoplastic or thermosetting resin, it is necessary to provide the plastic with a special conducting coating prior to the electroplating process. In the latter application, if there are discontinuous areas to be plated, it is necessary to provide an electrical contact to each one of the separate areas. In the making of printed circuit boards, where there are many isolated areas on a single board, such a procedure is very time consuming and expensive. Furthermore, when electroplating articles with sharp edges, the electroplated copper tends to form a heavier coat at the sharp edges than it does on the plane surfaces. Also, it is very difficult to electroplate the walls of holes. These difficulties are obviated by the use of the copper plating processes and solutions forming the subject matter of this application.

There are known techniques for obtaining flash coatings of chemical plated copper. However, these techniques utilize chemical solutions which decompose spontaneously during the plating process. In order to obtain any substantial thickness of copper plate by these known techniques, it requires a great number of such flash coatings. Because the chemicals and the solution used in these techniques are spent in forming each flash coating, the procedure is wasteful of chemicals and hence too costly. Such a process as this not only plates the desired object with copper but also any other surfaces which are in contact with the solution during the plating operation, including the container walls. Furthermore, a great deal of the copper in the solution is precipitated as cuprous oxide rather than plated as copper. These side reactions are wasteful of the chemicals in the copper plating solution.

In a copending application of A. E. Cahill et al., Serial No. 610,401, filed September 17, 1956, now Patent No. 2,874,072, and assigned to the same assignee as the present application, there is disclosed and claimed an electroless method of copper plating wherein copper ion, complexed with tartrates or salicylates and stabilized with a carbonate in an alkaline solution of definite hydroxyl ion concentration, is reduced with formaldehyde to produce a copper plate on a sensitized surface. Although this method produces satisfactory copper plating, the stability of the solution depends on the accurate control of many factors, as brought out in the specification. Also, the ingredients must be added in a precise order. Furthermore, the solutions are relatively slow in starting and in plating copper. The present invention overcomes these problems.

In my copending application S.N. 725,450, filed concurrently herewith, and assigned to the same assignee as the present invention, I have disclosed and claimed an electroless method of copper plating wherein copper ion is complexed with specific ethyleneaminoacetic acids. In a copending application of Maynard C. Agens, S.N. 725,449, filed concurrently herewith and assigned to the same assignee as the present invention, there is disclosed and claimed an electroless method of copper plating wherein copper ion is complexed with certain tertiary ethanolamines. I have now discovered that the benefits of both the use of the ethyleneaminoacetic acids and the ethanolamines can be combined into one plating solution by the use of certain tertiary alkanolaminoacetic acids.

It is an object of the present invention to provide new and improved, commercially practical, copper plating solutions and processes for the autocatalytic chemical plating of copper.

Another object of the invention is to provide new and improved copper plating solutions and processes which are capable of plating thick coatings of copper in any desired pattern onto objects having any desired surface configuration or shape.

A still further object of the invention is to provide new and improved chemical copper plating solutions which are relatively stable and which do not decompose spontaneously during the plating action, so that a consecutive series of objects may be plated in the solution until the copper is exhausted from the solution.

A still further object of the invention is to provide copper plating solutions and processes which plate only upon preselected, sensitized surfaces.

A still further object of this invention is to provide copper plating solutions and processes having the above listed characteristics which do not require elaborate electrical or other equipment for use in conjunction therewith.

These and other objectives, which will be obvious to those skilled in the art, may be better understood by reference to the drawing in which FIG. 1 is a simplified flow diagram which is representative of the general aspects of the process which is explained in greater detail in the following description.

My process utilizes an aqueous solution having a pH of 10–14 containing formaldehyde and a cupric ion complex of an alkanolaminoacetic acid having the formula:

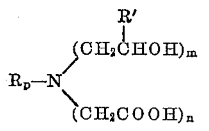

wherein $m$ and $n$ are both integers and are at least 1 and not more than 2, $p$ is an integer and is at least 0 and not more than 1, the sum of $m$, $n$ and $p$ equaling 3; R is a member of the group consisting of hydrocarbon radicals having from 1 to 10 carbon atoms, and the

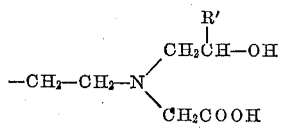

grouping and R′ is a member of the group consisting of hydrogen and methyl. Typical examples of hydrocarbon radicals that R can be are: methyl, ethyl, propyl, butyl, amyl, hexyl, heptyl, octyl, nonyl, decyl, phenyl, tolyl, xylyl, ethylphenyl, naphthyl, benzyl, phenethl, etc. Since this R group does not enter into the plating reaction, or aid in the complexing of the copper ion, its exact chemical constitution is not important, providing it does not interfere with the complexing or plating reaction.

When $p$ is zero, the complexing agent can be, for example,

N-(2-hydroxyethyl)-N,N-di-(carboxymethyl) amine;
N-(2-hydroxypropyl)-N,N-di-(carboxymethyl) amine;
N,N-di-(2-hydroxyethyl)-N-carboxymethylamine,
N,N-di-(2-hydroxypropyl)-N-carboxymethylamine,
N-(2-hydroxyethyl)-N-(2-hydroxypropyl) - N - carboxymethylamine.

When $p$ is one, the complexing agent can be, for example,

N-(2-hydroxyethyl)-N-carboxymethyl-methylamine,
N-(2-hydroxypropyl)-N-carboxymethyl-methylamine,
N-(2-hydroxyethyl)-N-carboxymethylethylamine,
N-(2-hydroxypropyl)-N-carboxymethyl-butylamine,
N-(2-hydroxyethyl)-N-carboxymethyl-decylamine,
N-(2-hydroxypropyl)-N-carboxymethylbenzylamine,
N-(2-hydroxyethyl)-N-carboxymethylphenethylamine,
N-(2-hydroxypropyl)-N-carboxymethylphenylamine,
N,N'-di-(2-hydroxyethyl) - N,N' - di - (carboxymethyl)-ethylenediamine,
N,N'-di-(2-hydroxypropyl)-N,N' - di - (carboxymethyl)-ethylenediamine,
N-(2-hydroxyethyl) - N' - (2 - hydroxypropyl)-N,N'-di-(carboxymethyl)-ethylenediamine, etc.

In preparing my solution, the base, copper salt and complexing agent can be mixed in any order desired, for example: the cupric salt can be added to the base to precipitate cupric hydroxide and the desired complexing agent added, the cupric salt and the complexing agent can be mixed or added as the preformed cupric complex and the base added thereafter, or the cupric salt can be added to a mixture of the complexing agent and base. As will be evident to those skilled in the art, those carboxyl groups of the complexing agent which are not used in complexing the cupric ion will react with the base to form salts. Therefore, rather than starting with a free acid, I may start with a salt of the complexing agent, whereby one or more of the carboxyl groups have been reacted with a cation which may be the same or different from the cation of the base used in making the plating solution. The only requirement for the cation forming the salt is that it must not form a complex more stable than the cupric ion does with the complexing agent, since, in such a case, the complexing agent is unable to react with the cupric ion.

I prefer to use bases to form the salts of the complexing agent, and to obtain the desired pH in the plating baths whose cation is, at most, only slightly complexed by the complexing agent. Such metallic cations are conveniently grouped as alkali metals in the Periodic System. Therefore, the bases I prefer to use are, for example, lithium, sodium, potassium, rubidium, and cesium hydroxides. Of these I prefer to use sodium and potassium hydroxides. Carbonates and bicarbonates can be used in forming the salts of the complexing agent but are not strong enough alkalis to produce the desired pH range. The alkaline earth metal hydroxides, for example, calcium, barium, and strontium hydroxides, can also be used. However, their solubility in water is not as great as the alkali metal hydroxides, and their cations form more stable complexes than the alkali metal cations with the complexing agent.

Another class of hydroxides, which I have found very satisfactory, is that of the tetraalkyl ammonium hydroxides, such as the tetramethyl ammonium hydroxides, diethyldimethyl ammonium hydroxide, tetraethyl ammonium hydroxide, tetrabutyl ammonium hydroxide, tetraethanol ammonium hydroxide, and the like.

Any cupric salt may be used providing it is capable of supplying cupric ions to form the complex. Readily available copper salts which I may use are cupric sulfate, cupric nitrate, cupric chloride, cupric acetate, cupric hydroxide, and so forth, there being nothing critical as regards the anion associated with the copper other than it should not decrease the cupric ion concentration in the solution below the level where it can form a complex as mentioned above. Cupric sulfate represents the lowest cost, most readily available copper salt, and is preferred only for this reason.

The chemical equation expressing the plating reaction can be written in the following form:

(I)
$$Cu^{++} + 4OH^- + 2HCHO \rightarrow Cu^0\downarrow + 2HCOO^- + H_2\uparrow + 2H_2O$$

From an examination of this equation, the following facts will be evident to those skilled in the art:

(1) The particular anion associated with the copper and the particular cation associated with the hydroxyl group are both immaterial as regards to entering into the reaction. However, since the reaction is ionic, the particular anion associated with the copper and the particular cation associated with the hydroxyl group should not be such that they prevent ionization. Stated another way, they should not form such aqueous insoluble compounds that no copper ions or hydroxyl ions are present in the solution.

(2) Under ordinary conditions, the cupric ion and the hydroxyl ions would form cupric hydroxide, an insoluble compound. A function, therefore, of the complexing agent is to so complex the cupric ion that while it is not precipitated by the hydroxyl ion yet it will be available for the reducing action indicated whereby it is reduced to metallic copper.

(3) Hydrogen is a by-product of the reaction and normally tends to collect on the surface of the article being plated with copper causing the copper to form a spotty and irregular coating. This effect can be minimized by having present in the plating reaction materials known to reduce the surface tension of water such as alcohols and surfactants.

Although I have tried to obtain the reducing action in my plating solution with other aldehydes, only formaldehyde and formaldehyde engendering agents such as paraformaldehyde can be used to produce satisfactory copper coatings.

Although not evident from the above equation, the particular complexing agents of this invention provide a further benefit to the plating solution in that they prevent the plating reaction from occurring unless a sensitizing metallic surface is also present in the reaction solution. By a sensitizing metallic surface, I mean any surface containing a visible or invisible film of metal capable of causing my solution to plate copper. These surfaces can be massive pieces of metal or they can be visible or invisible metallic films on a non-metallic substrata. It will be evident to those skilled in the art that my plating solution can be used for two purposes; it can be used to copper-plate pieces of metal, or it can be used to copper-plate non-metallic surfaces. Almost any clean metal surface which is not reactive with alkaline aqueous solutions will act as a sensitizing metallic surface and may be plated with copper by merely bringing the metallic surface in contact with the plating solution. Although metallic surfaces, which are reactive with alkaline solutions, can be plated with my solutions, the plate is not smooth and adherent because of the reaction of the metal with the solution to produce hydrogen. Since oils, greases, dirt and other films will prevent proper wetting of the metallic surface, they should be removed prior to the plating process unless they are used purposely to mask and prevent plating of certain areas when it is desired to copper-plate controlled areas to produce a design or pattern. Typical metallic surfaces which can be copper plated by my process include iron, cobalt, nickel, gold, silver, platinum, palladium, rhodium, tin, copper, etc., including alloys, such as carbon steels, stainless steels, Monel, the karat golds, sterling and coin silver, platinum-iridium alloys, etc.

It is necessary to provide the non-metallic surfaces to be copper plated by my solutions with a coating of sensitizing metal. Although any of the above-named metals can be used to form the sensitizing metallic surface, from a practical standpoint it is only possible to easily provide the non-metallic surface with a sensitizing metal selected from the group consisting of nickel, cobalt, copper, rhodium, silver, gold, platinum and palladium. It is preferable to roughen the non-metallic surface by either chemical or mechanical means, such as chemical etching, roughening by solvent attack, sandpapering, sandblasting, and the like. This roughening process not only removes any invisible film which might prevent the plating of the copper, but it also enables the sensitizing metal and the copper plate to be anchored more firmly and to be more adherent than they would be if this step were omitted. Treating the roughened surface with a stannous chloride solution followed by washing with water and treating with a solution of a silver, gold, platinum, rhodium, or palladium salt will provide an invisible film of the particular metal used. The stannous chloride treatment may be omitted if the silver or other noble metal salt is not very soluble in the plating solution. In this case the salt is dissolved in a material which is a good solvent for the salt. This solution is used to treat the surface to be plated. When brought in contact with the plating solution, the formaldehyde will reduce the salt to the metal and form a sensitized surface on which the copper will plate. Salts of organic acids such as acetic, propionic, butyric, oleic, palmitic, stearic, naphthenic, benzoic, naphthoic, etc., are ideal for this application. They can be dissolved in benzene, toluene, xylene, or other organic solvent to form a solution to be used as outlined above. The solutions can be extremely dilute, e.g., 1% by weight of salt, and are preferred over more concentrated solutions. Best results are obtained when the solvent for the silver salt also has a slight solvent effect on the material being sensitized. A quick rinse with pure solvent removes the excess silver salt on the surface which will tend to cause a weakly adherent copper plate if not removed. A film of silver or copper may be formed on the non-metallic surface using the well known "silver mirror" techniques. Metallic films can also be formed by decomposition of metallic hydrides or by vacuum metalizing techniques. Once any of the above metallic coatings have been formed on the non-metallic surface, nickel or cobalt coatings can be formed on the primary metal surface by the method of Brenner and Riddell, "Journal of Research of the National Bureau of Standards," 39, 385–395 (1947), entitled, "Deposition of Nickel and Cobalt by Chemical Reduction." Normally, the addition process step and the expense of providing secondary nickel and cobalt coatings do not warrant such a procedure, since a single sensitizing coating gives very satisfactory results. Once the sensitizing coating is on the non-metallic surface, either as a visible or invisible film, it can be brought in contact with my plating solution without further treatment to obtain the desired thickness of copper plate.

It will be noticed that copper itself is a sensitizing metal for my plating solution. Therefore, the primary film of sensitizing metal, needed to initiate the plating of copper, can be extremely thin. All that is required of the primary film is for it to form a thin film of copper over the entire desired area. Once this is accomplished, the process is autocatalytic since any copper film will cause additional copper to plate out. As long as the chemical conditions are as specified, the plating reaction continues until either the surfaces being plated are removed or the copper ion is exhausted from the solution. The autocatalytic nature of the plating reaction permits the object to be removed from the plating solution and examined to determine the thickness and quality of the plate and to clean any areas which might not be plating properly without having the plating reaction continue, thereby wasting the reagents. Furthermore, if copper did not catalyze the reaction, it would be impossible to build up a thick plate of copper without re-sensitizing the surfaces many times. The ability to form a thick copper plate is a necessary requirement for solutions that are used to produce copper films, which must have low electrical resistance and high current carrying capacities without becoming overheated, for example, printed electrical circuits.

In an alkaline formaldehyde solution, a competing reaction to the plating reaction shown by Equation I occurs and is illustrated by:

$$\text{(II)}\quad 2Cu^{++}+5OH^{-}+HCHO \rightarrow Cu_2O\downarrow+HCOO^{-}+3H_2O$$

This reaction is non-catalytic and will occur in the absence of sensitizing metals. In the presence of my complexing agents, the reaction is subordinate to the plating reaction, but it is influenced by temperature and the concentration of cupric ions. The cuprous oxide precipitate formed in this reaction is reduced by the alkaline formaldehyde to copper metal, which will initiate the autocatalytic copper plating reaction. Therefore, the stability of the solution depends on maintaining the solution free of precipitated copper and cuprous oxide. To insure maximum stability, the minimum quantity of the other ingredients making up my plating bath is dependent upon the amount of copper salt used. Excess of the other reagents over that required can be used except for the amount of base which is limited by the requirement that the pH of the solution must be in the range of 10 to 14. There must be present at least two alkanolamineacetic acid groups for each mole of copper, if the copper is to be sufficiently complexed to provide satisfactory stability and plating characteristics of the solution. When my complexing agent is a monoamino compound, at least two moles of the complexing agent are required for each mole of copper. When the complexing agent is a diamino derivative, at least one mole of complexing agent is required for each mole of copper. If there are other completing cations in the solution which will form complexes, a greater amount of complexing agent is required, but usually no more than two to three moles of complexing agent needs to be used for each mole of copper. Because they are readily available, easy to use, and do not require an excess amount of complexing agent, I prefer to use sodium, potassium, or a quaternary ammonium hydroxide as both my source of base and salt-forming cation of the complexing agent.

The amount of base used is dependent on whether or not the complexing agent is added as a free acid or whether it is added as the preformed salt. No excess base needs to be added if the complexing agent has been added as a preformed salt, whereby all of the carboxylic acid groups have been neutralized with a base. Otherwise, one mole equivalent of base must be used for each free, unneutralized carboxylic acid group. Enough base must also be added to neutralize any acidity of the formaldehyde. In addition, four equivalents of base must be used for each mole of copper used. This is the stoichiometric amount shown by Equation I. However, in order to maintain the desired pH, I may use up to six equivalents of base. My experiments have shown that it is preferable to use only that amount exceeding four equivalents which is necessary to maintain the pH in the lower region of the specified pH ranges during the plating reaction, rather than to operate in the higher region.

There should be at least two moles of formaldehyde used for each mole of copper, but larger excesses can be used with no deleterious results. However, for economy and ease of controlling the reaction, I prefer not to have an extremely large excess of formaldehyde in the solution. The formaldehyde can be added all at one time or added stepwise or continuously during the plating reaction.

In addition to the above desired molar proportions of the reactants, I have also found that the rate of formation of the plating coating as well as the length of time that the solution is stable without a precipitate forming is dependent upon the molar concentration of copper. For example, if the molar concentration of the copper exceeds 0.2, the rate of the reaction shown by Equation II becomes significant and the solution tends to be unstable. When the molar concentration of the copper is below 0.05, the plating reaction is relatively slow although the stability of the solution is very high. Several methods are available for lengthening the solution life, one of which is to remove the precipitated cuprous oxide or copper by continuously filtering the solution to remove the precipitate. Reducing the temperature of the plating solution increases the solution life. Another method is to continuously bubble air or other oxygen containing gas through the solution. This latter process is disclosed and claimed in the copending application of Maynard C. Agens, S.N. 725,451, now Patent No. 2,938,-805, filed concurrently herewith and assigned to the same assignee as the present invention. By this method, the bubbling of a fine stream of oxygen-containing gas through a well-agitated solution is capable of increasing the life of the solution for at least 3 or 4 times and usually 30 to 40 times its normal life.

For a given solution, the total rate at which copper is deposited is directly proportional to the catalytic surface area. Therefore, it is advantageous to plate as large an area as possible per volume of plating solution. This depletes the solution of copper before serious decomposition occurs and increases the volume efficiency. This is an especially useful technique, therefore, to use with the more concentrated plating solutions.

The plating rate is affected not only by cupric ion concentration and the ratio of catalytic surface area to volume of solution, but also by the temperature of the solution. As the temperature is increased the plating rate also increases. Unfortunately the decomposition reaction to form cuprous oxide also increases with temperature. Therefore, for best results I prefer not to have the temperature of my plating solutions exceed 50° C. and usually not to exceed 35° C. The temperature can be as low as the freezing point of the solution, but I have not found any benefit to be gained by operating at such low temperatures. Normally I prefer to have the temperature no lower than 10° C. and usually no lower than 15° C. Completely satisfactory results are obtained by operating at ambient temperature, e.g., 20–30° C. When using large volumes of plating solution, the exothermic nature of the plating reaction produces enough heat that it is sometimes necessary to cool the solution, e.g., with cooling coils through which cold water or refrigerant is circulating.

When operating at ambient temperature (20–30° C.) with plating solutions containing cupric ion in the range of 0.05 to 0.2 molar and the amount of copper in solution is in large excess of that plated out, I will obtain plating rates in the range of 0.05 to 0.5 mil per hour. The final thickness I can obtain is not limited by the ability of my solutions to produce a thick coat, but by the practical aspect that, if the coefficient of expansion of the copper and substrate are not matched, an exeremely thick plate of copper (e.g., 10 mils or thicker) will pull away from the substrate or subjected to repeated heating and cooling cycles. Normally I have found 3–4 mil copper coatings to be thick enough for all practical applications although thicker coatings can be produced.

As will be exident, there must be at least as much copper in solution as is required to plate the desired area with the desired thickness. The minimum volume of solution required to produce the desired thickness is a function of the cupric ion concentration. When using low copper concentrations or high copper concentration with the Agens stabilizing technique, it is possible to use large volumes of plating solution, carrying out the plating of one batch of articles until the desired thickness of copper is attained and then adding subsequent batches of articles.

A wetting agent improves the quality of the copper plate laid down. It accomplishes this by reducing the size of the hydrogen bubbles given off and by facilitating maximum penetration of the plating solution into the cracks and crevices of the substrate. Almost any surfactant can be used, such as, for example, the non-ionic, the quaternary ammonium salt, the alkyl phenol sulfonate, and the alkyl sulfate types of surfactants. Sodium lauryl sulfate is a relatively inexpensive easily available material which I have found particularly useful.

For best operation of the plating bath, agitation and filtration are highly desirable. Agitation in addition to maintaining uniform concentration, helps to detach the hydrogen bubbles from the surface being plated, thereby giving a better quality plate and preventing streaking of the areas where plating is undesired. Filtration removes loose copper particles and cuprous oxide from the solution, thereby minimizing solution decomposition and extraneous plating. Some of the loose copper particles probably are caused by copper being torn from the surface by the evolved hydrogen gas. This is particularly noticeable when concentrated plating solutions are used.

In practice, filtration and agitation can be combined. The pump circulates the solutions through a filter and this creates sufficient stirring of the plating bath.

Since the copper plate laid down by my process has only a mechanical bond to the non-metallic substratum, the adhesion is a function of the roughness and wettability of the surface of the plating solution. Consequently, adhesion to a polished or extremely hydrophobic surface which is repellent to the plating solution is nil, while adhesion to a porous, rough, wettable surface is very good.

In practice, for non-metallic substrata comprising the shaped article containing (1) a synthetic resin such as laminated or molded phenolic, urea, melamine, alkyd, silicone, ethanoid, etc., resins, or (2) a high-gloss surface such as glass and the like, a light sandblast before sensitization provides excellent adhesion. In those cases where a silicone resin is to be plated, an alkali soak (e.g., in a 5% aqueous sodium or potassium hydroxide solution) has proved desirable before sensitizing the surface with a metal film. Porous materials such as unglazed ceramics require no surface preparation before sensitization other than to insure that they are clean and wettable by the plating solution. The degree of adhesion obtained on non-metallic surfaces is apparently also dependent on the ease with which the surface is wetted by the plating solution. Those surfaces containing materials which easily absorb water such as cellulose fibers, form very strong bonds with the copper plate.

Selectivity is the ability to plate where it is desired, while not plating areas where it is not desired. This can be achieved in two ways: (1) only the areas to be plated are sensitized, (2) the whole item is sensitized and the areas not to be plated are masked with a resist. The latter method is easier to accomplish and is more reproducible. Silk screen techniques can be used to readily mask intricate patterns or designs on the surface. A solution of polystyrene in toluene or xylene gives exceptionally good results when used to make the resist. It may be thickened and colored by incorporating solid pigments, dyes or any of the well known fillers used in plastics and paint manufacture, e.g., carbon black, zinc oxide, zinc chromate, lithopone, silica, titanium dioxide, lead oxide, iron oxide, etc. Not only is it water repellent and alkali resistant, but it is easily removed when desired. Most polyester resins, nitrocellulose lacquers, and polyvinyl alcohol are too readily penetrated by the highly alkaline solution to function satisfactorily as resists. In order that those skilled in the art may better understand how my invention may be carried into effect, the following examples, carried out at the ambient temperature are given by way of illustration, and not by way of limitation.

*Example 1*

A solution was made up containing the following ingredients in the stated concentration:

| Ingredients: | Molarity |
|---|---|
| Cupric sulfate | 0.1 |
| Sodium hydroxide | 0.8 |
| N,N-di(2-hydroxyethyl) glycine | 0.2 |
| Formaldehyde | 0.3 |

A piece of paper-base, phenolic-resin laminated board which had been sandblasted was dipped into a stannous chloride solution prepared by dissolving 10 grams of stannous chloride and 20 milliliters of 12 molar hydrochloric acid in sufficient water to make one liter. It was allowed to remain in the solution for 1 minute, removed, rinsed in running water, and dipped for 1 minute in a palladium chloride solution made by dissolving 1 gram of palladium chloride in ten milliliters of 12 molar hydrochloric acid and diluted with water to 1 liter. After removal from the palladium chloride solution the board was rinsed with running water and placed in the copper plating solution. The laminate had been sensitized by the formation of an invisible film of palladium. Hydrogen began to be evolved at once from the surface of the board and a bright copper plate deposited concurrently. After 1 hour there was no appreciable decomposition of the solution as would have been evidenced by the precipitation of extraneous copper. The copper plate at the end of this time on the phenolic board was bright and very cohesive and was approximately 1 mil in thickness.

*Example 2*

Example 1 was repeated except that the sodium hydroxide was only 0.6 molar in the solution. The results obtained with this solution were identical with those obtained in Example 1.

*Example 3*

A solution was prepared containing the following ingredients in the stated concentrations:

| Ingredients: | Molarity |
|---|---|
| Cupric sulfate | 0.1 |
| Sodium hydroxide | 0.7 |
| N - (2-hydroxyethyl)N,N',N'-tricarboxymethyl ethylene diamine | 0.1 |
| Formaldehyde | 0.4 |

A phenolic resin paper base laminate sandblasted and sensitized as in Example 1 with palladium was placed in 250 milliliters of this solution. A vigorous evolution of hydrogen began immediately, simultaneously with the plating of copper on the phenolic board. At the end of 1 hour the board was coated with about a 1 mil thick, very bright, adherent copper plate and precipitation of extraneous copper was barely perceptible in the solution.

*Example 4*

A solution was prepared containing the following ingredients in the stated concentration:

| | Molarity |
|---|---|
| Cupric sulfate | 0.10 |
| Sodium salt of N-(2 - hydroxyethyl) N - carboxymethyl-methylamine | 0.3 |
| Sodium hydroxide | 0.4 |
| Formaldehyde | 0.3 |

A piece of sandblasted paper-base, phenolic-resin laminate was dipped for one minute in a solution made by dissolving 10 grams of stannous chloride and 10 ml. of 12 N hydrochloric acid in one liter of water, rinsed with water, dipped for one minute in an aqueous 1% solution of silver nitrate and again rinsed with water. Such a process sensitizes the laminate by producing an invisible film of silver on its surface.

When the sensitized laminate was placed in the above copper plating solution, copper plated on the surface as a firmly adherent film simultaneously with the evolution of hydrogen.

*Example 5*

An attempt to substitute nitrilotriacetic acid $$N(CH_2COOH)_3$$

for the alkanol amino acetic acids in the above example gave a solution which, although it started to plate, turned green and turbid and precipitated copper in a period of 5 minutes. It was entirely unsatisfactory as a stable plating solution. The fact that this acid could not be used is rather surprising in view of the results obtained in my copending application with ethylene diamine tetraacetic acid. Evidently, when a compound which contains only one amino nitrogen is used for complexing the copper, an alkanol group is required. Just what function this alkanol group serves is not yet clear.

When there is present at least one carboxyl group and one alkanol group on the monoamino group, the third valence of the nitrogen atom may be satisfied with any hydrocarbon radical. However, since the material must be soluble in my plating solution, it is desirable that the hydrocarbon contain no more than approximately 10 carbon atoms.

In addition to being able to plate on phenolic-resin, paper-base laminates, as illustrated in the above examples, I can form satisfactory coats on metals, glass, ceramic, or other non-metallic surfaces such as synthetic resins including but not limited to silicone-resin, glass laminates; alkyd-resin, glass-filament laminates; urea or melamine molded and laminated articles; styrene; methyl methacrylate; vinyl chloride; nylon; Mylar film, etc. The widest application for my invention, presently, is in the making of printed circuit boards having good insulation and high temperature resistance with regard to the resinous composition, coupled with the ability to be plated over selected areas with a copper plate having good electrical conductivity and current carrying capacity. In this regard, I have formed excellent printed circuit boards by using electrical grade (ASTM and NEMA standards) phenolic-resin, paper-base laminates having holes punched therethrough as the substratum onto which I have plated the desired copper circuit pattern with my solutions. The process and solutions of this invention are very satisfactory for forming printed circuits having the desired degree of electrical conductivity and current carrying capacity. The walls of the holes are plated without excess build-up at the sharp edges to provide electrical contact between the two surfaces. Other means than by the use of palladium chloride may be used to sensitize the surface of non-metals, as is more fully discussed above and as is shown in more detail in my copending application, previously mentioned.

From the foregoing description, it can be seen that the present invention provides a commercially practicable, chemical copper plating solution and process for the chemical plating of copper on catalytic reactive metallic surfaces or non-metallic materials which have been sensitized with a visible or invisible film of metal. By means of this invention, relatively thick coatings of copper may be plated on a surface. However, should it be desired to do so, once a copper coating has been formed, the standard electroplating procedure can be used to plate additional copper.

The above examples have illustrated many of the modifications and variations of the present invention, but obviously other modifications and variations of the present invention are possible in light of the above teaching. It is therefore to be understood that changes may be made in the particular embodiments of the invention described which are within the full intended scope of the invention as defined by the appended claims.

What I claim as new and desire to secure by Letters Patent of the United States is:

1. A solution for the autocatalytically plating of copper on an active metallic surface which comprises an aqueous solution having a pH in the range of 10 to 14 containing formaldehyde and the cupric ion complex of an alkanolamino acetic acid having the formula

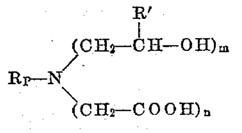

where $m$ and $n$ are both integers having the value of at least 1 and not more than 2, $p$ is an integer and is at least 0 and no more than 1, the sum of $m$, $n$ and $p$ being equal to 3, R is a member of the group consisting of hydrocarbon radicals having from 1 to 10 carbon atoms, and the

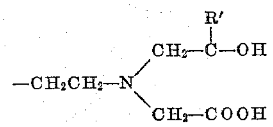

grouping, and R′ is a member of the group consisting of hydrogen and methyl.

2. The solution as in claim 1 wherein the cupric ion is complexed with N-(2-hydroxyethyl)-N-carboxymethylmethylamine.

3. The solution as in claim 1 wherein the cupric ion is complexed with N,N-di-(2-hydroxy ethyl) glycine.

4. The solution as in claim 1 wherein the cupric ion is complexed with N-(2-hydroxy ethyl) N,N′,N′-tri-(carboxy methyl) ethylene diamine.

5. The solution as in claim 1 wherein the pH of the aqueous solution is obtained by using a base selected from the group consisting of sodium hydroxide, potassium hydroxide, and tetraalkyl ammonium hydroxides.

6. The solution as in claim 5 wherein the base is sodium hydroxide.

7. The solution as in claim 1 wherein the copper is present in a concentration of from 0.05 to 0.2 molar.

8. The process of autocatalytically plating copper which comprises contacting an active metallic surface with the solution of claim 1.

9. The process as in claim 8 wherein the active metallic surface is palladium.

10. The process of autocatalytically plating copper on a non-metallic substratum which comprises forming a film of a metal selected from the group consisting of nickel, cobalt, copper, silver, rhodium, gold, platinum and palladium on the surface of the non-metallic body and thereafter contacting the sensitized non-metal with the solution of claim 1.

11. The process as in claim 10 wherein the film of metal is made by reducing a carboxylic salt of the metal with formaldehyde.

References Cited in the file of this patent

UNITED STATES PATENTS

| | | |
|---|---|---|
| 2,454,610 | Marcus | Nov. 23, 1948 |
| 2,475,974 | Max | July 12, 1949 |
| 2,482,354 | Max et al. | Sept. 20, 1949 |
| 2,602,757 | Kantrowitz et al. | July 3, 1952 |
| 2,759,845 | Hilemn | Aug. 21, 1956 |
| 2,776,918 | Bersworth | Jan. 8, 1957 |
| 2,819,187 | Gutzeit | Jan. 7, 1958 |
| 2,871,139 | Wein | Jan. 27, 1959 |
| 2,872,346 | Miller | Feb. 3, 1959 |
| 2,874,072 | Cahill et al. | Feb. 17, 1959 |
| 2,930,106 | Wrotnowski | Mar. 29, 1960 |
| 2,938,805 | Agens | May 31, 1960 |

FOREIGN PATENTS

| | | |
|---|---|---|
| 604,644 | Great Britain | July 7, 1948 |

OTHER REFERENCES

Marboe et al.: The Glass Industry, vol. 26, No. 3, March 1945.

Marcus: Metal Finishing, vol. 50, No. 3, March 1952.